(12) United States Patent
Takemura et al.

(10) Patent No.: US 6,483,093 B1
(45) Date of Patent: Nov. 19, 2002

(54) SOLAR GENERATOR SYSTEM

(75) Inventors: Kazuhito Takemura, Wako (JP); Hidetaka Kayanuma, Wako (JP)

(73) Assignee: Honda Giken Kogyo Kabushiki Kaisha, Tokyo (JP)

( * ) Notice: Subject to any disclaimer, the term of this patent is extended or adjusted under 35 U.S.C. 154(b) by 22 days.

(21) Appl. No.: 09/717,100

(22) Filed: Nov. 22, 2000

(30) Foreign Application Priority Data

Nov. 24, 1999 (JP) ............................................. 11-332341

(51) Int. Cl.$^7$ ................................ G01J 1/20; H01J 5/16
(52) U.S. Cl. ...................................... 250/203.4; 250/216
(58) Field of Search .......................... 359/245; 136/246, 136/251, 259, 206, 205, 243; 437/209; 250/216, 203.4

(56) References Cited

U.S. PATENT DOCUMENTS

| 4,454,372 A | * | 6/1984 | Appleby ...................... 136/250 |
| 4,933,022 A | * | 6/1990 | Swanson ..................... 136/244 |
| 5,125,983 A | * | 6/1992 | Cummings ................... 136/246 |
| 5,512,742 A | * | 4/1996 | Mattson ....................... 126/573 |

FOREIGN PATENT DOCUMENTS

JP    7-231111    8/1995

* cited by examiner

*Primary Examiner*—Georgia Epps
*Assistant Examiner*—Omar Hindi
(74) *Attorney, Agent, or Firm*—Arent Fox Kintner Plotkin & Kahn, PLLC

(57) ABSTRACT

A solar generator system includes a solar cell for photo-electrically converting sunlight, a multi-focus lens for condensing and converging the sunlight to the solar cell, and a secondary light-condenser which is formed into an inversed truncated conical shape with a portion adjacent to the lens being of a larger diameter, and which is disposed on the solar cell with a light-receiving face being opposed to the lens so as to introduce converged rays from the lens to the solar cell. The secondary light-condenser has a light-receiving surface which is formed into a cornet shape and includes a circular planar portion, and a slant portion which is formed into a tapered shape with the diameter thereof being larger as it goes away from the lens and which has a smaller-diameter end connected to an outer periphery of the planar portion.

5 Claims, 8 Drawing Sheets

TOP-DOME TYPE

CORNET TYPE

SOLAR GENERATOR SYSTEM

BACKGROUND OF THE INVENTION

1. Field of the Invention

The present invention relates to a solar generator system including a solar cell for photo-electrically converting sunlight, a lens for condensing and converging the sunlight to the solar cell, and a secondary light-condenser which is formed into an inversed truncated conical shape with a portion adjacent to the lens being of a larger diameter, and which is disposed on the solar cell with a light-receiving surface being opposed to the lens so as to introduce converged rays from the lens to the solar cell.

2. Description of the Related Art

Such a solar generator system is already known, for example, from Japanese Patent Application Laid-open No.7-231111.

When the focus of a lens is set on a solar cell to condense the sunrays onto the solar cell by the lens to generate an electric power, the sunrays are too concentrated locally. For this reason, there is a possibility that a disturbance may be produced in flows of electrons produced in the solar cell by the photoelectric conversion and as a result, the generating efficiency is reduced, and the solar cell is raised locally in temperature to a high level and thermally deteriorated. In addition, the light-condensing efficiency is degraded largely even by a slight displacement of the light-condensing position. Therefore, particularly, when a system for generating an electric power by tracking sunrays is constructed, the light-condensing efficiency may be reduced largely due to an influence of a mechanical error in a tracking device or the like.

On the contrast, in the system disclosed in the above Japanese Patent Application Laid-open No.7-231111, a secondary light-condenser of a single-cone type is placed on a solar cell and formed with a side of an inversed truncated conical optical lens body having a planar light-receiving surface being covered with a metal or the like. The light-condensing efficiency can be enhanced by the secondary light-condenser, and even if a slight displacement of an angle of irradiation of sunlight to the lens is produced, a reduction in performance can be compensated for by covering the slight displacement by the relatively wide light-receiving surface of the secondary light-condenser. The effective condensing of the sunlight is possible, but is insufficient for the purpose of avoiding the local concentration of the sunlight in order to prevent a reduction in power-generating efficiency and a thermal deterioration. When the light-condensing magnification is increased, any measure is required.

On the other hand, as disclosed in Japanese Patent Application Laid-open No.7-92309, it is a conventional practice to increase the width of an effective light flux applied to a solar cell by use of a multi-focus linear Fresnel lens, so that even if the angle of irradiation of sunlight to the lens is displaced slightly, the local convergence of the sunlight to the solar cell can be avoided, while avoiding a remarkable reduction in light-condensing efficiency. However, a portion of the light condensed by the lens is wasted and for this reason, a reduction in power-generating efficiency is unavoidable.

SUMMARY OF THE INVENTION

Accordingly, it is an object of the present invention to provide a solar generator system, wherein even if the sunlight to the lens is displaced slightly, the light-condensing efficiency can be prevented from being degraded largely, and the occurrences of a reduction in power-generating efficiency and a thermal deterioration can be prevented.

To achieve the above object, according to a first aspect and feature of the present invention, there is provided a solar generator system comprising a solar cell for photo-electrically converting sunlight, a lens for condensing and converging the sunlight to the solar cell, and a secondary light-condenser which is formed into an inversed truncated conical shape with a portion adjacent to the lens being of a larger diameter, the secondary light-condenser being disposed on the solar cell with a light-receiving surface being opposed to the lens so as to introduce converged rays from the lens to the solar cell, wherein the light-receiving surface of the secondary light-condenser is formed into a truncated conical shape and has a circular planar portion, and a slant portion which is formed into a tapered shape with the diameter thereof being larger as the slant portion goes away from the lens and which has a smaller-diameter end connected to an outer periphery of the planar portion, and the lens comprises a multi-focus lens with foci set on the side of the light-receiving surface being displaced from one another.

With such arrangement, the inverted truncated conical secondary light-condenser is placed on the solar cell and hence, even if a slight displacement of an angle of irradiation of the sunlight to the lens is produced, this displacement can be corrected by the secondary light-condenser to prevent a large degradation in light-condensing efficiency. In addition, since the lens is the multi-focus lens, the sunrays condensed by the lens are dispersed and irradiated to the secondary light-condenser, and the rays from the lens are refracted in different directions by the secondary light-condenser of a cornet type and introduced to the solar cell. Therefore, it is possible to avoid that the sunrays are locally concentrated and converged onto the surface of the solar cell, thereby preventing the temperature of the solar cell from locally rising to reduce the generating efficiency and to produce a thermal deterioration. To further disperse the rays from the lens to introduce them to the solar cell, a secondary light-condenser of a top-dome type with a light-receiving face formed into a spherical crown-shape can be used. However, when the top-dome type secondary light-condenser is used, a light flux in a central area may be reduced remarkably due to the displacement of a light-condensing position in some cases and hence, there is a possibility that an outer peripheral portion of the solar cell is raised in temperature to a high level and thermally deteriorated. On the contrast, in a cornet-type secondary light-condenser, the light flux can be dispersed in an entirely well-balanced manner, as compared with the top-dome type secondary light-condenser and hence, there is not a possibility that a thermal deterioration of the above-described type is produced. Moreover, the cornet-type secondary light-condenser is also easy to manufacture, as compared with the top-dome type secondary light-condenser.

According to a second aspect and feature of the present invention, in addition to the first feature, the lens is a circular Fresnel lens having an outer surface formed into a polygonal shape. With such configuration, when a generating unit is constructed using large numbers of lenses, secondary light-condensers and solar cells in combination, a space required for the disposition of the large number of lenses can be reduced in size, as compared with circular lenses, whereby the generating unit can be formed compactly.

According to a third aspect and feature of the present invention, in addition to the first or second feature, the inclination angle of the slant portion is set at a value ensuring the avoidance of the total reflection of light irradiated from the lens to the slant portion. With such feature, it is possible to introduce rays condensed by the lens to the solar cell with being wasted, thereby further enhancing the generating efficiency.

According to a fourth aspect and feature of the present invention, in addition to the first or second feature, the lens is formed such that the focus of an outermost lens portion of the lens is located at a point closer to the center of the planar portion. With such feature, even if a slight displacement of the light-condensing position is produced due to the retardation of the tracking of sunlight, an assembling error or the like, rays from the lens can be irradiated or applied reliably to the secondary light-condenser, thereby effectively inhibiting the degradation in a light-condensing efficiency.

According to a fifth aspect and feature of the present invention, in addition to the first or second feature, the planar portion is disposed at a location displaced from a focus position of the entire lens in a direction away from the lens. With such feature, rays from the lens can be faded as a whole and irradiated or applied to the secondary light-condenser, and the rays applied from the lens to the secondary light-condenser can be faded by the displacement of the light-condensing position. Thus, even if a slight displacement of a light-condensing position is produced due to the retardation of the tracking of sunlight, an assembling error or the like, rays from the lens can be irradiated reliably to the secondary light-condenser, thereby effectively inhibiting the degradation of the light-condensing efficiency.

The above and other objects, features and advantages of the invention will become apparent from the following description of the preferred embodiment taken in conjunction with the accompanying drawings.

DESCRIPTION OF THE PREFERRED EMBODIMENT

The present invention will now be described by way of an embodiment with reference to the accompanying drawings.

Figure 1:
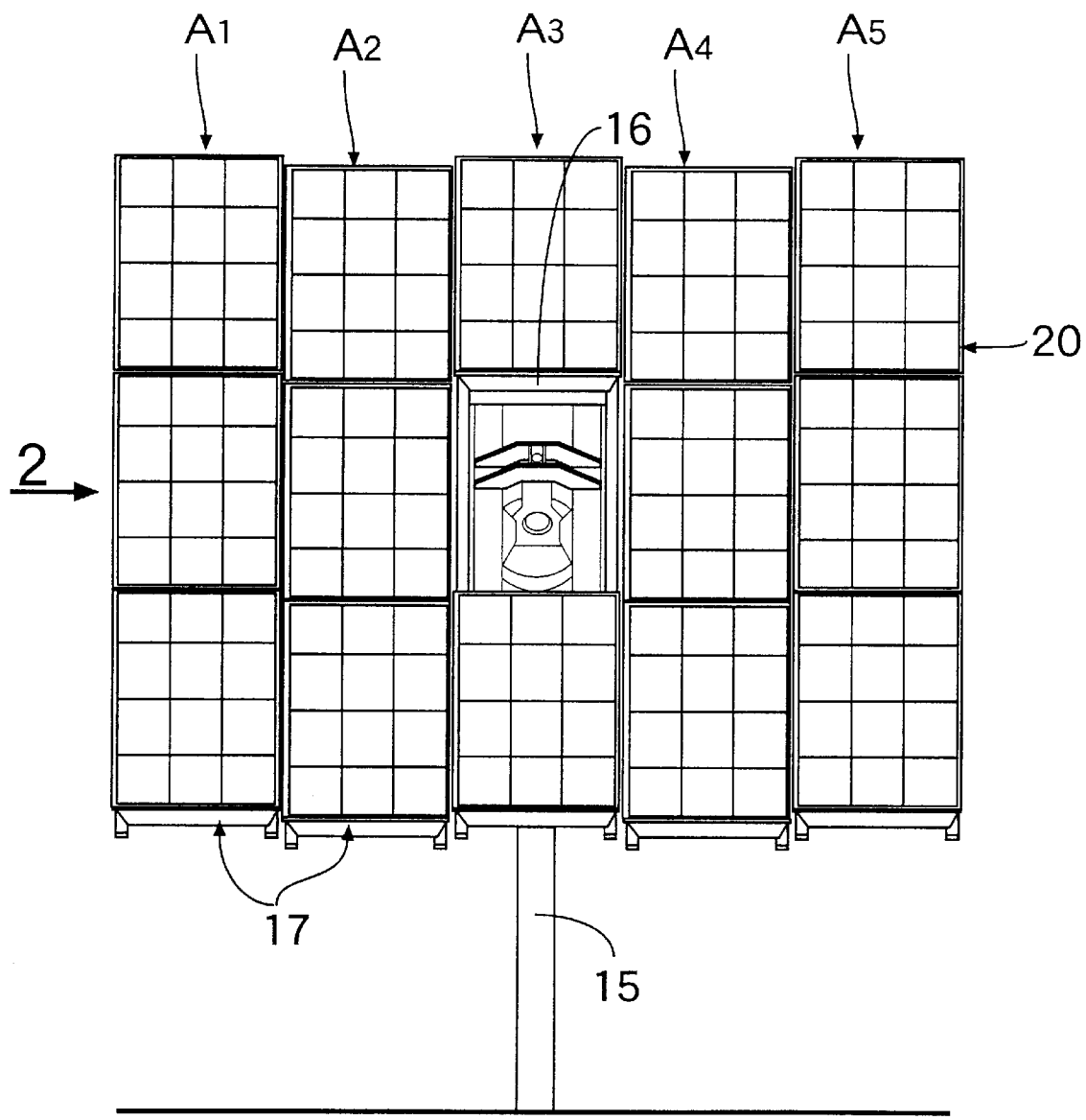
FIG. 1 is a front view of a solar generator system.
Figure 2:
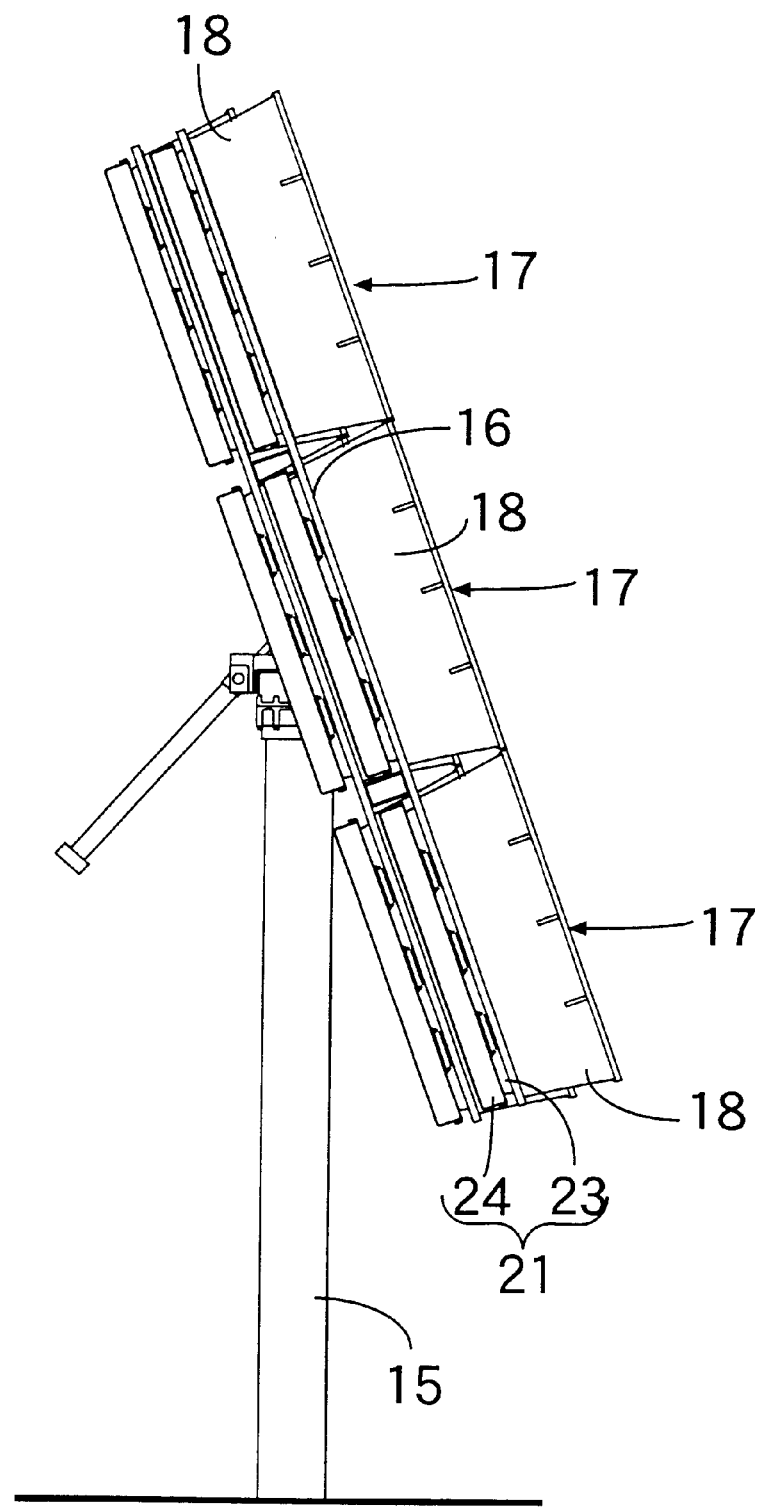
FIG. 2 is a side view taken in the direction of an arrow 2 in FIG. 1.

Referring first to FIGS. 1 and 2, a solar generator system includes a vertically extending stationary post 15, a unit-supporting frame 16 supported at an upper end of the post 15 for turning movement about a vertical axis and about a horizontal axis and a plurality of power generating units 17 mounted on the unit-supporting frame 16. Each of the generating units 17 is driven by a drive means (not shown) to track the sun.

The generating units 17 are mounted on the unit-supporting frame 16, so that first, second, third, fourth and fifth arrays A1, A2, A3, A4 and A5 are arranged in parallel and laterally adjacent to one another. Each of the first, second, fourth and fifth arrays A1, A2, A4 and A5 is comprised of, for example, the three generating units 17 arranged, and in the third array A3, for example, the two generating units 17 are arranged in such a manner that a central area in the array A3 is empty with no generating unit mounted therein. Moreover, the generating units 17 are mounted on the unit-supporting frame 16 in such a manner that a difference in level is produced between each of the first, third and fifth arrays A1, A3 and A5 and each of the second and fourth arrays A2 and A4.

Figure 3:
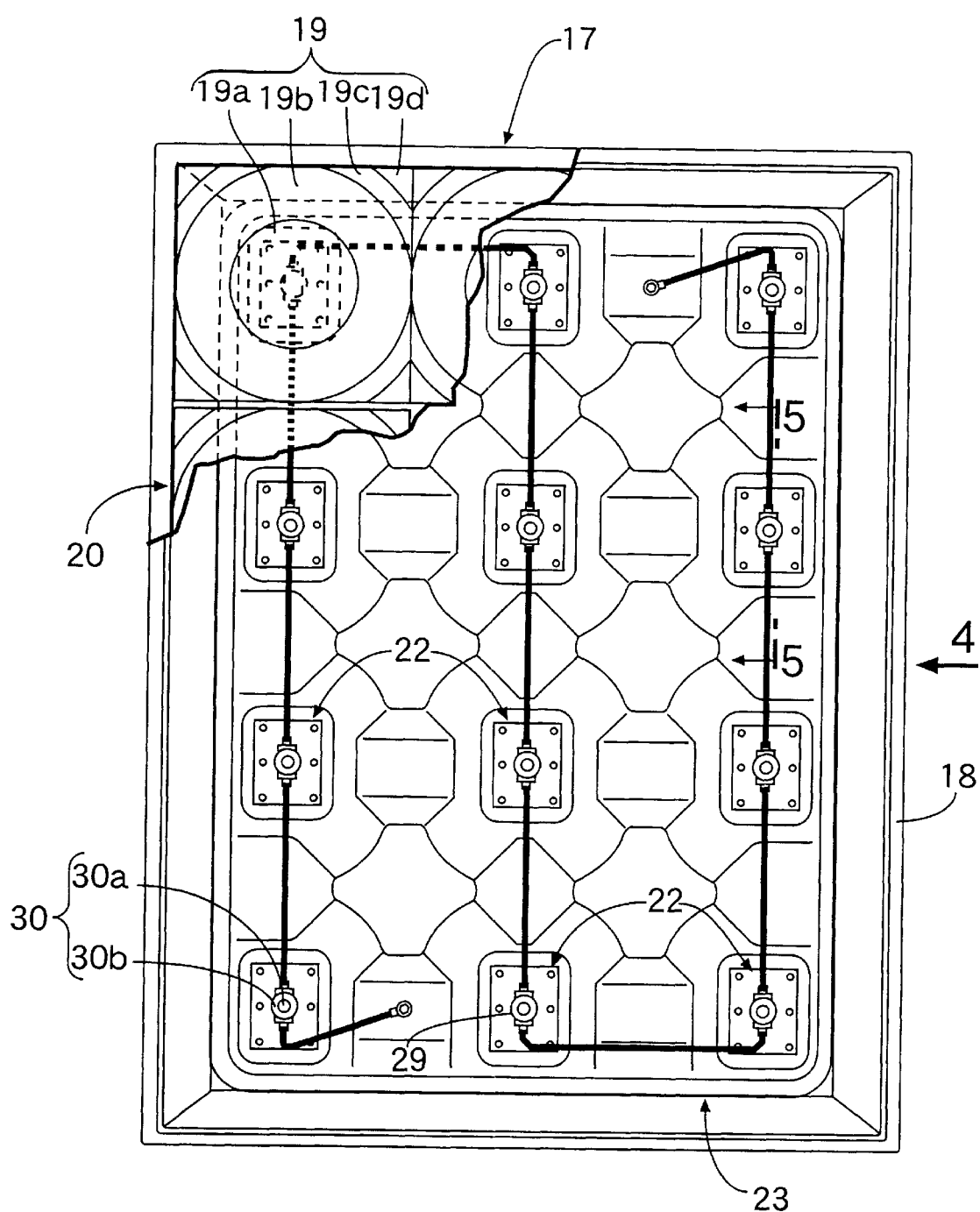
FIG. 3 is a partially cutaway front view of generating units.
Figure 4:
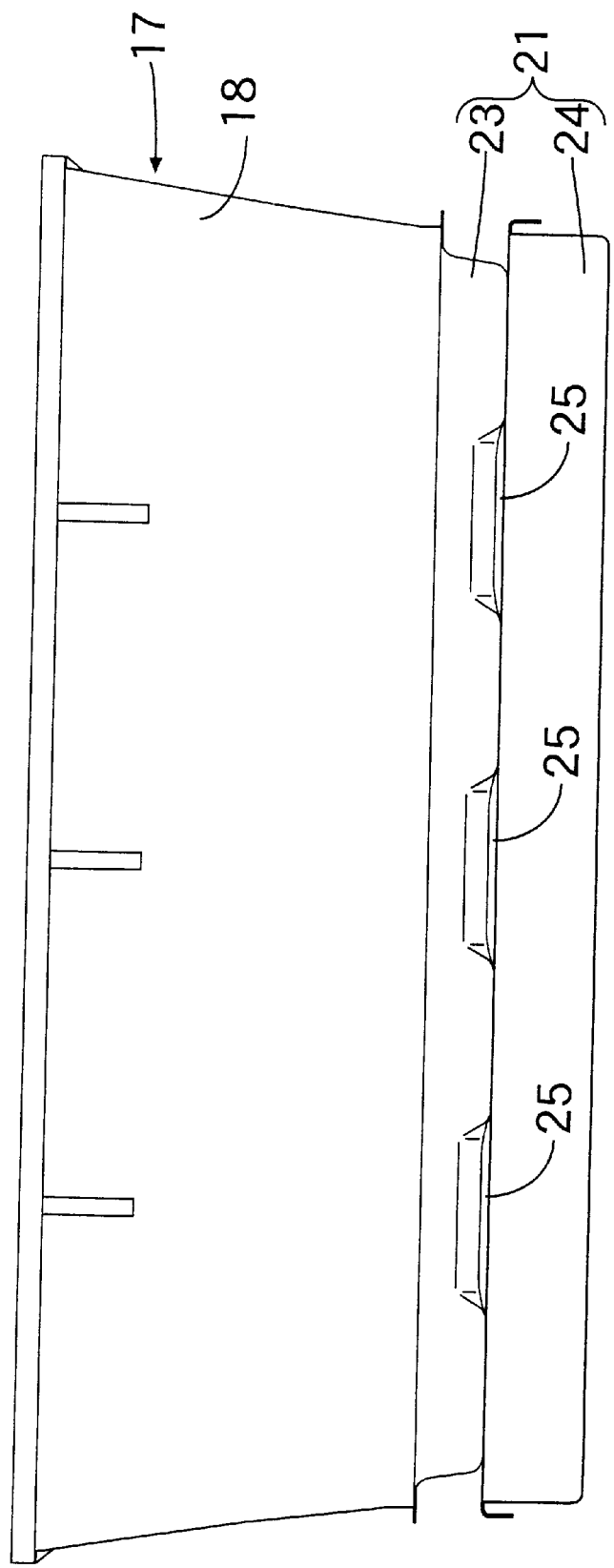
FIG. 4 is a side view taken in the direction of an arrow 4 in FIG. 3.

Referring to FIGS. 3 and 4, each of the generating units 17 includes a cylindrical lens frame 18 with its upper and lower ends opened, a lens assembly 20 comprised of a plurality of lenses 19 and closing an opening in the upper end of the lens frame 18, a support plate 21 mounted at a lower end of the lens frame 18 to close an opening in the lower end of the lens frame 18, and a plurality of solar cell modules 22 mounted on an inner surface of the support plate 21 in individual correspondence to the lenses 19.

The lens frame 18 is formed into a truncated quadrangular pyramidal shape with a rectangular cross section such that the sectional area is reduced gradually as going from an uppermost portion toward a lower most portion. The lens assembly 20 formed flatly is mounted at the upper end of the lens frame 18.

The support plate 21 comprises a heat-radiating panel 24 made of an aluminum alloy, which is bonded by welding or by another means to a lower surface of a base panel 23 made of an aluminum alloy. A plurality of cooling air ducts 25 are defined longitudinally and laterally between the base panel 23 and the heat-radiating panel 24.

Figure 5:
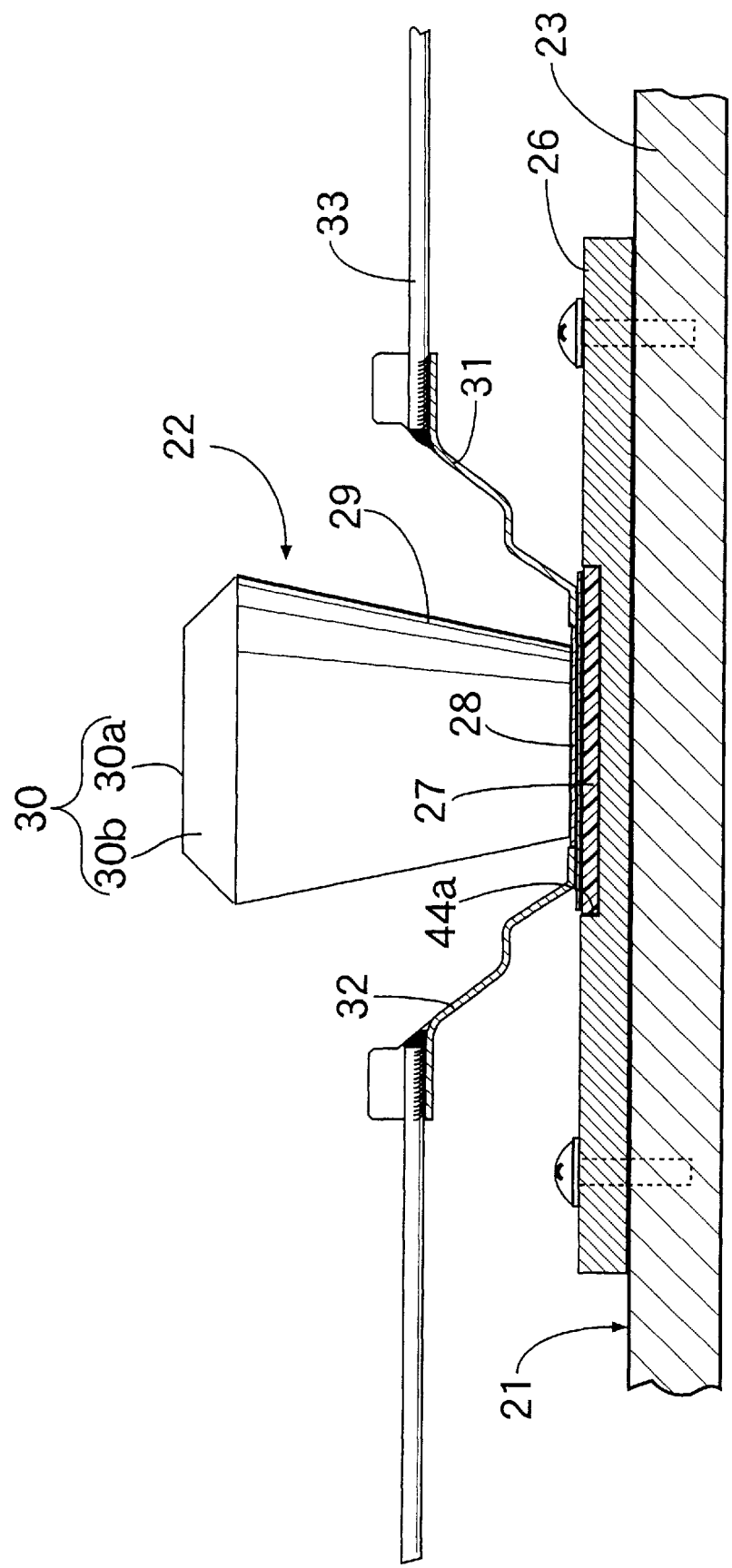
FIG. 5 is a sectional view taken along a line 5—5 in FIG. 3.

Referring to FIG. 5, each of the solar cell modules 22 is mounted on the base panel 23 of the support plate 21. The solar cell module 22 includes a heat spreader 26 fastened to an upper surface of the base panel 23, a base plate 27 affixed on the heat spreader 26, a solar cell 28 fixedly bonded on the base plate 27, and a secondary light-condenser 29 affixed on the solar cell 28.

The solar cell 28 is bonded on the base plate 27 by an adhesive or by another means. The secondary light-condenser 29 is formed into an inversed truncated conical shape in such a manner that a side of an optical lens body which is reduced in diameter as going in a downward direction is covered with a metal plate or the like. A upper end surface, i.e., a light-receiving surface 30 of the secondary light-condenser 29 is formed into a truncated conical shape, namely, a so-called cornet-shape, and has a circular planar portion 30a, and a slant portion 30b which is formed into such a tapered shape that the diameter thereof is more increased as it goes away from the lens 19, and which has a smaller-diameter end connected to an outer periphery of the planar portion 30a.

On the other hand, the lens 19 comprises a circular Fresnel lens which is a multi-focus lens with foci established on the side of a light-receiving surface 30 of the secondary light-condenser 29 being displaced from one another. The lens 19 is formed with its outer surface being of a polygonal shape, e.g., a square shape.

The lens 19 comprises first, second, third and fourth lens portions 19a, 19b, 19c and 19d having a plurality of, e.g., four types of shapes, which are arranged on concentric circles, as shown in FIG. 3. More specifically, the lens 19 having the outer surface of the square shape comprises the first circular lens portion 19a, the second ring-shaped lens portion 19b having an outside diameter inscribed with the square and concentrically surrounding the first lens portion 19a, the third four arcuate lens portions 19c arranged outside the second lens portion 19b at four corners of the square, and the fourth four lens portions 19d arranged at portions of the four corners of the square excluding the third lens portions 19c. Moreover, the lens 19 is formed such that foci of the outermost lens portions of the lens 19, i.e., the fourth lens portions 19d, are located at points closer to the center of the planar portion 30a of the light-receiving surface 30.

Figure 6:
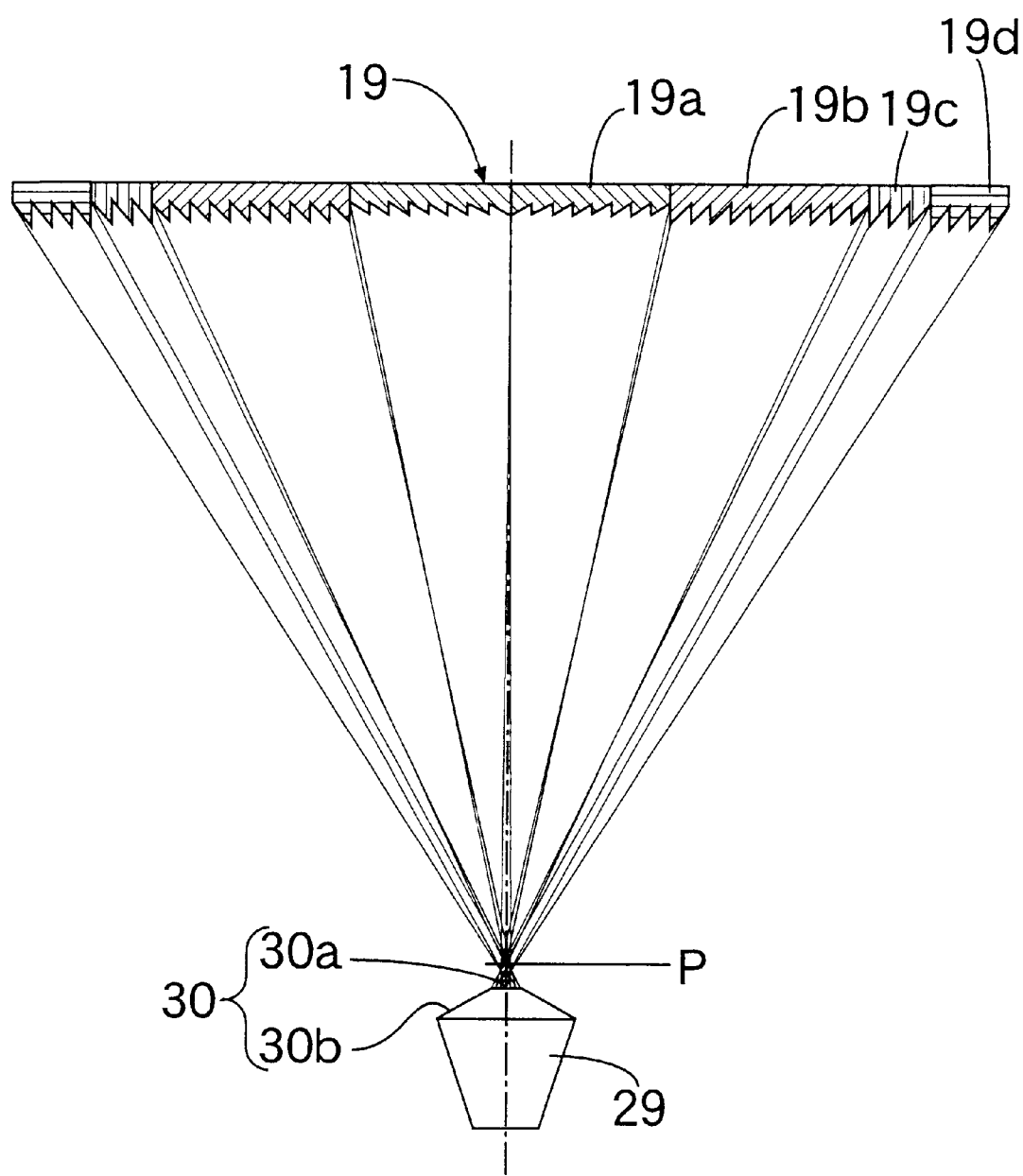
FIG. 6 is an illustration showing the positional relationship between each focus position of a lens and a light-receiving face of a secondary light-condenser.

Referring to FIG. 6, the secondary light-condenser 29 is arranged such that the planar portion 30a of the light-receiving surface 30 is disposed at a location displaced from a focus position P of the entire lens 19 away from the lens 19. Moreover, the angle of inclination of the slant portion 30b is set at a value ensuring the avoidance of the total reflection of light reflected from the lens 19 at the time when light from the lens 19 enters into the slant portion 30b of the light-receiving portion 30.

Figure 7:
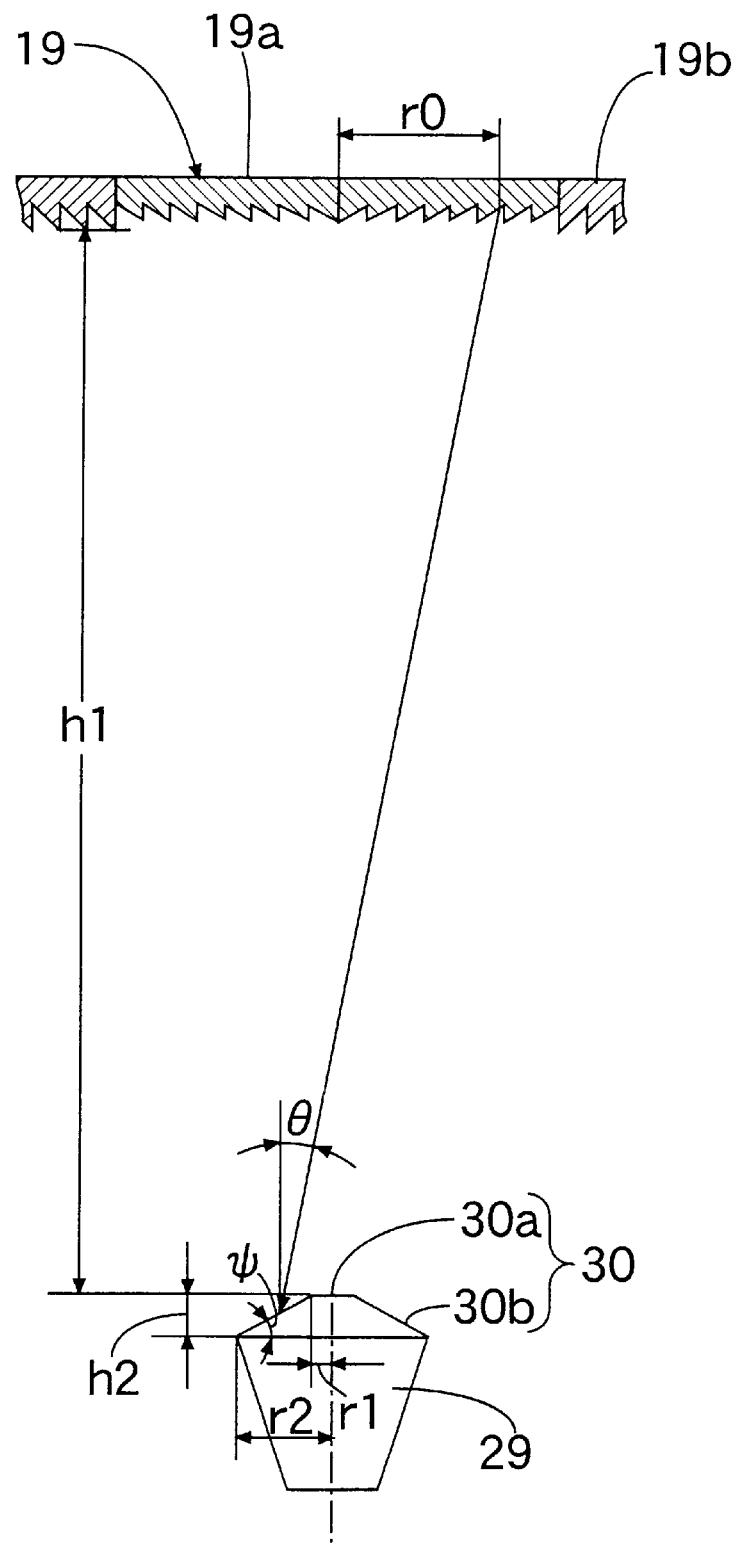
FIG. 7 is an illustration showing a state in which rays from the lens are irradiated to a slant portion of a light-receiving face.

When the inclination angle of the slant portion 30b is represented by $\phi$; the angle of incidence from the lens 19 is represented by $\theta$; and the refractive index of the optical lens body of the secondary light-condenser 29 is represented by n, as shown in FIG. 7, it is required, in order to avoid the total reflection of light from the slant portion 30b, that the following relation is established:

$$90-\theta-\phi > \sin^{-1}(1/n)$$

and it is required that the inclination angle $\phi$ is an angle satisfying the following relation:

$$\phi < 90-\theta-\sin^{-1}(1/n)$$

When the length from the center of the lens 19 to a point of irradiation of light onto the slant portion 30b is represented by r0; the height from the light-receiving surface 30 to the lens 19 is represented by h1; the radius of the smaller-diameter end of the tapered slant portion 30b, i.e., the radius of the planar portion 30a is represented by r1; the radius of the larger-diameter end of the slant portion 30b is represented by r2; and the height of the slant portion 30b along the axis of the secondary light-condenser 29 is represented by h2, the inclination angle $\phi$ and the angle $\theta$ of incidence are represented as follows, respectively:

$$\phi = \tan^{-1}\{h2/(r2-r1)\}$$

$$\phi = \tan^{-1}(r0/h1)$$

Referring again to FIG. 5, plus-side and minus-side power output terminals 31 and 32 are connected to an electrode formed on the base plate 27 outside the solar cell 28, and the solar cell modules 22 are connected in series to one another by conductors 33 connected to the power output terminals 31 and 32.

The operation of the embodiment will be described below. The placement of the secondary light-condenser 29 of the inverted truncated conical shape on the solar cell 28 ensures that even if a slight displacement is produced in the angle of irradiation of sunlight to the lens 19, such displacement can be corrected by the secondary light-condenser 29 to prevent the light condensing efficiency from being deteriorated largely.

The light-receiving surface 30 of the secondary light-condenser 29 is formed into the truncated conical shape and has the circular planar portion 30a, and the slant portion 30b which is formed into such a tapered shape that the diameter thereof is more increased as it goes away from the lens 19, and which has the smaller-diameter end connected to the outer periphery of the planar portion 30a, whereas the lens 19 is formed as the multi-focus lens with the foci established on the side of the light-receiving surface 30 being displaced from one another. Therefore, sunrays condensed by the lens 19 are dispersed and applied to the secondary light-condenser 29. The rays from the lens 19 are refracted in different directions by the cornet-shaped secondary light-condenser 29 and introduced to the solar cell 28. Thus, it is possible to avoid that the sunrays are locally concentrated and converged onto the surface of the solar cell 28, thereby preventing the temperature of the solar cell 28 from being locally raised to reduce the power-generating efficiency and to produce a thermal deterioration.

Figure 8A:
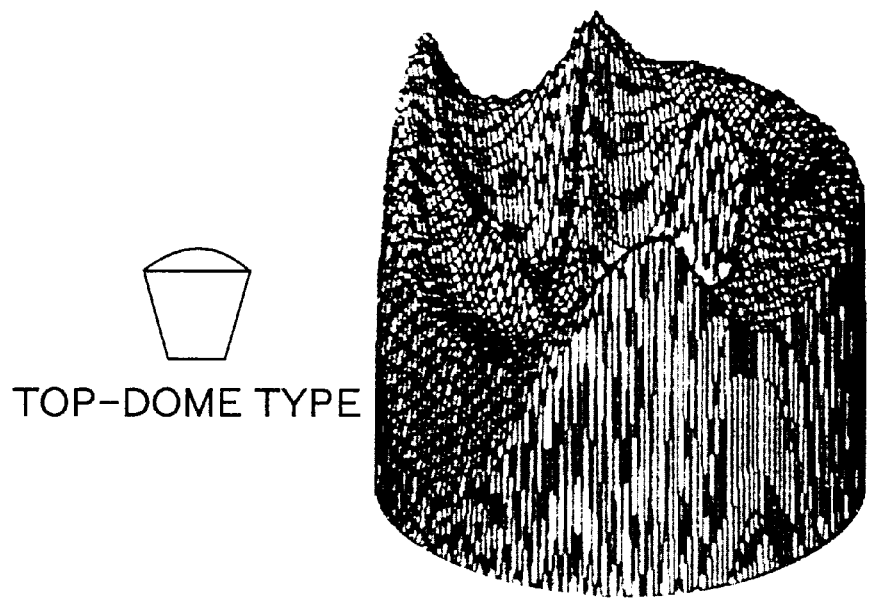
FIGS. 8A and 8B each show a distribution of rays condensed on a surface of a solar cell in a state in which a light-condensing position on the secondary light-condenser is displaced by one degree, FIG. 8A corresponding to a case where a secondary light-condenser of a top-dome type is used, and FIG. 8B corresponding to a case where a secondary light-condenser of a cornet type is used.
Figure 8B:
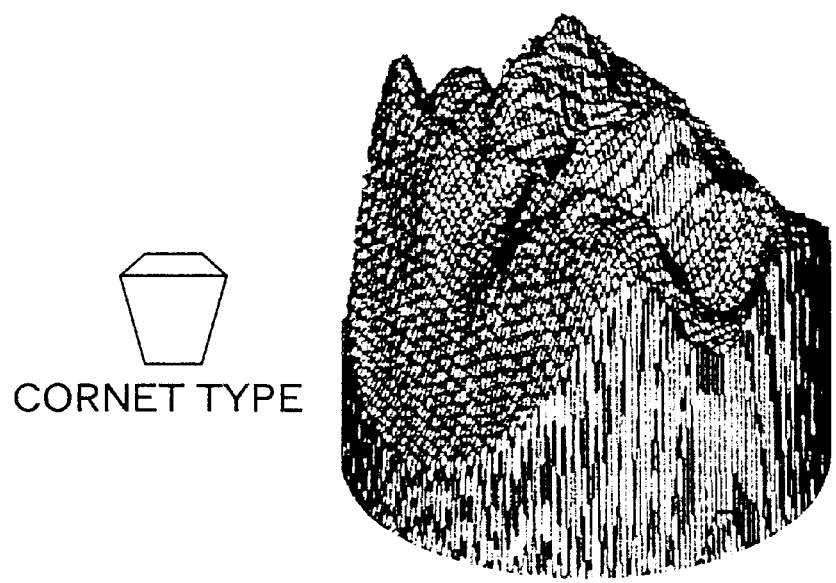

To further disperse the rays from the lens 19 to introduce them to the solar cell, a secondary light-condenser of a so-called top-dome type having a light-receiving surface formed into a spherical crown-shape can be used. However, when the secondary light-condenser of the top-dome type is used, a light flux in a central area may be reduced remarkably in some cases due to the displacement of a light-condensing position, as shown in FIG. 8A and hence, there is a possibility that the outer peripheral portion of the solar cell 28 may be locally raised in temperature to a high level and thermally deteriorated. On the contrast, in the secondary light-condenser 29 of the cornet type according to the present invention, the light flux can be dispersed in an entirely well-balanced manner, as shown in FIG. 8B, as compared with the top-dome type secondary light-condenser. Therefore, there is not a possibility of a thermal deterioration produced as described above and moreover, the cornet-type secondary light-condenser 29 is easy to manufacture, as compared with the top-dome type secondary light-condenser.

In addition, the lens 19 is the circular Fresnel lens having the outer surface formed into the polygonal shape, as described above and hence, when the power-generating unit 17 is constructed using large numbers of the lenses 19, the secondary light-condensers 29 and the solar cells 28 in combination, a space required for disposition of the large number of lenses 19 can be reduced in size, as compared with circular lenses 19, whereby the power-generating unit 17 can be formed compactly.

Further, the inclination angle $\phi$ of the slant portion 30b in the light-receiving surface 30 of the second light-condenser 29 is set at the value ensuring the avoidance of the total reflection of light applied from the lens 19 to the slant portion 30b, as described above. Therefore, light rays condensed by the lens 19 can be introduced to the solar cell 28 without being wasted, leading to a further enhanced power-generating efficiency.

Further, the lens 19 is formed so that foci of the outermost lens portions 19d of the lens 19 are located at points closer to the center of the planar portion 30a of the light-receiving surface 30. Therefore, even if a slight displacement of the light-condensing position is produced due to the retardation of the tracking of the sunlight, an assembling error or the like, rays from the outermost lens portions 19d, whose irradiating or applying positions are liable to be displaced from the secondary light-condenser 29, can be irradiated reliably to the light-receiving surface 30 of the secondary light-condenser 29. Thus, it is possible to ensure the reliable irradiation of the rays from the lens 19 to the secondary light-condenser 29 to effectively inhibit the degradation of the light-condensing efficiency.

Yet further, the planar portion 30a of the light-receiving surface 30 is disposed at the location displaced from the focus position P of the entire lens 19 away from the lens. Therefore, the rays from the lens 19 can be faded as a whole and irradiated or applied to the secondary light-condenser 29, and the rays applied from the lens 19 to the secondary light-condenser 29 can be faded by the displacement of the light-condensing position. Thus, even if a slight displacement of the light-condensing position is produced due to the retardation of the tracking of the sunlight, an assembling error or the like, rays from the lens 19 can be irradiated reliably to the secondary light-condenser 29, thereby effectively inhibiting the degradation of the light-condensing efficiency.

Although the embodiment of the present invention has been described in detail, it will be understood that the present invention is not limited to the above-described embodiment, and various modifications in design may be made without departing from the spirit and scope of the invention defined in claims.

What is claimed is:

1. A solar generator system comprising a solar cell for photo-electrically converting sunlight, a lens for condensing and converging the sunlight to said solar cell, and a secondary light-condenser which is formed into an inversed truncated conical shape with a portion adjacent to said lens being of a larger diameter, said secondary light-condenser being disposed on said solar cell with a light-receiving surface being provided at said portion of a larger diameter of said inversed truncated conical shape and opposed to said lens so as to introduce converged rays from said lens to said solar cell, wherein said light-receiving surface of said secondary light-condenser is formed into a truncated conical shape and has a circular planar portion, and a slant portion which is formed into a tapered shape with the diameter thereof being larger as said slant portion goes away from said lens and which has a smaller-diameter and connected to an outer periphery of said planar portion, and said lens comprises a multi-focus lens with foci set on the side of said light-receiving surface being displaced from one another.

2. A solar generator system according to claim 1, wherein said lens is a circular Fresnel lens having an outer surface formed into a polygonal shape.

3. A solar generator system according to claim 1 or 2, wherein the inclination angle of said slant portion is set at a value ensuring the avoidance of the total reflection of light irradiated from said lens to said slant portion.

4. A solar generator system according to claim 1 or 2, wherein said lens is formed such that the focus of an outermost lens portion of said lens is located at a point closer to the center of said planar portion.

5. A solar generator system according to claim 1 or 2, wherein said planar portion is disposed at a location displaced from a focus position of the entire lens in a direction away from said lens.

* * * * *